United States Patent
Lehto

(10) Patent No.: US 7,358,777 B2
(45) Date of Patent: *Apr. 15, 2008

(54) CURRENT FEEDBACK AMPLIFIERS

(75) Inventor: Jeffrey S. Lehto, Sunnyvale, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/765,772

(22) Filed: Jun. 20, 2007

(65) Prior Publication Data

US 2007/0241793 A1    Oct. 18, 2007

Related U.S. Application Data

(63) Continuation of application No. 11/593,288, filed on Nov. 6, 2006, now Pat. No. 7,250,791, which is a continuation of application No. 11/082,752, filed on Mar. 17, 2005, now Pat. No. 7,132,860.

(60) Provisional application No. 60/611,771, filed on Sep. 21, 2004, provisional application No. 60/554,150, filed on Mar. 18, 2004.

(51) Int. Cl.
H03F 3/45    (2006.01)

(52) U.S. Cl. .................... 327/52; 327/65; 327/563; 330/252; 330/258

(58) Field of Classification Search ............ 327/52–54, 327/56, 65–67, 563; 330/252, 253, 257–259
See application file for complete search history.

(56) References Cited

U.S. PATENT DOCUMENTS

| 4,904,953 | A | 2/1990 | McCormack |
|---|---|---|---|
| 5,179,355 | A | 1/1993 | Harvey |
| 5,187,448 | A | 2/1993 | Brooks et al. |
| 5,266,852 | A | 11/1993 | Shigenari et al. |
| 5,321,370 | A | 6/1994 | Yukawa |
| 5,374,897 | A | 12/1994 | Moravejii |
| 5,418,495 | A | 5/1995 | Harvey |
| 5,420,542 | A | 5/1995 | Harvey |
| 5,568,089 | A | 10/1996 | Maru |
| 5,699,010 | A | 12/1997 | Hatanaka |
| 5,742,154 | A | 4/1998 | Kolluri |
| 5,812,026 | A | 9/1998 | Fairgrieve |
| 6,031,424 | A | 2/2000 | Fairgrieve |
| 6,265,941 | B1 | 7/2001 | Lopata |
| 6,362,682 | B2 | 3/2002 | Shulman |
| 6,459,338 | B1 | 10/2002 | Acosta et al. |
| 6,535,064 | B2 | 3/2003 | Harvey |
| 6,556,081 | B2 | 4/2003 | Muza |
| 6,586,997 | B1 | 7/2003 | D'Aquino |
| 6,636,116 | B2 | 10/2003 | Cameron |
| 6,724,260 | B2 | 4/2004 | Varner et al. |
| 6,774,722 | B2 * | 8/2004 | Hogervorst ................. 330/258 |
| 6,867,649 | B2 | 3/2005 | Lehto |
| 6,888,407 | B2 | 5/2005 | Ramazan et al. |

(Continued)

Primary Examiner—Kenneth B. Wells
Assistant Examiner—Hai L. Nguyen
(74) Attorney, Agent, or Firm—Fliesler Meyer LLP

(57) ABSTRACT

Current feedback amplifiers circuits that generate common mode (CM) and/or differential mode (DM) currents are provided herein. This description is not intended to be a complete description of, or limit the scope of, the invention. Other features, aspects, and objects of the invention can be obtained from a review of the specification, the figures and the claims.

20 Claims, 11 Drawing Sheets

U.S. PATENT DOCUMENTS

| | | |
|---|---|---|
| 6,906,586 B2 | 6/2005 | Sakurai |
| 6,937,100 B2 | 8/2005 | Anderson |
| 6,998,917 B2 | 2/2006 | Kudo et al. |
| 7,116,132 B2 | 10/2006 | Lehto |
| 7,132,860 B2 | 11/2006 | Lehto |
| 7,250,791 B2 * | 7/2007 | Lehto .......................... 327/52 |

* cited by examiner

CURRENT FEEDBACK AMPLIFIERS

PRIORITY CLAIMS

This application is a continuation of U.S. patent application Ser. No. 11/593,288, filed Nov. 6, 2006, now U.S. Pat. No. 7,250,791 issued on Jul. 31, 2007, which is a continuation of U.S. patent application Ser. No. 11/082,752, filed Mar. 17, 2005, now U.S. Pat. No. 7,132,860, issued Nov. 7, 2006, which application claims priority under 35 U.S.C. 119(e) to the following provisional applications: U.S. Provisional Patent Application No. 60/611,771 filed Sep. 21, 2004; and U.S. Provisional Patent Application No. 60/554,150, filed Mar. 18, 2004. Each of the above applications is incorporated herein by reference.

RELATED APPLICATIONS

This application is related to the following commonly invented and commonly assigned patents: U.S. Pat. No. 7,132,859, entitled "Common-Mode Current Feedback Amplifiers," filed Mar. 17, 2005; and U.S. Pat. No. 7,116,132, entitled "Current Feedback Amplifiers with separate Common-Mode and Differential-Mode Inputs," filed Mar. 17, 2005. Each of the above applications is incorporated herein by reference.

FIELD OF THE INVENTION

Embodiments of the present invention relate to current feedback amplifiers, including common-mode current feedback amplifiers, differential-mode current feedback amplifiers, a combinations thereof.

BACKGROUND

FIG. 1A is a macro level diagram of a basic current feedback amplifier (CFA) 100. FIG. 1B, which is a high level circuit diagram, will be used to describe the basic operation of the current feedback amplifier (CFA) 100, which can be modeled as two ideal voltage buffers 106 and 108, a complementary pair of current mirrors 110 and 112 and feedback and gain resistors $R_F$ and $R_G$. When a voltage is applied to the non-inverting input 102, it is immediately buffered to the inverting input 104. Assuming a standard non-inverting op-amp configuration, this voltage causes a change in the current flowing through the feedback and gain resistors $R_F$ and $R_G$. The input voltage buffer 106 must supply this current; therefore the current must flow through the current mirrors 110 and 112 and is duplicated, causing a ΔI to be applied to a high-impedance node 114. This current, flowing into the high impedance node 114, causes a change in voltage that is then transferred to the CFA output 116 by the second buffer 108. The key thing to focus on in this case is that the amplifier's operation depends on correctly sensing and mirroring the change in current caused by the initial change in input voltage. This creates the "current feedback" nature of the amplifier.

Referring now to FIG. 2, a symmetrical pair of CFAs, labeled 100a and 100b, are hooked up in a standard differential gain configuration to form a differential amplifier circuit 200. Standard analysis using the concept of half-circuits leads to the ability to analyze the differential circuit in terms of two signal paths, one for differential-mode signals and one for common-mode signals (hereafter referred to as DM and CM, respectively). Any arbitrary input to the amplifier circuit 200 can be expressed as a sum of DM and CM components. Half-circuits 300a and 300b are shown explicitly in FIG. 3.

It is immediately apparent that the DM and CM signal paths will have different voltage gains and different loading effects, and that therefore optimizing the amplifier circuit 200 for one of the paths will inevitably compromise optimal performance on the other path. More generally it may be desirable to send completely different signals on the DM and CM signal paths. It may also be desirable to cancel out part or all of either the CM or DM signals. Therefore, the ability to tune the CM and DM paths independently is desirable.

SUMMARY

Current feedback amplifiers (CFAs) are beneficial because they provide for a large slew rate at small supply currents, and because their bandwidths are insensitive to closed-loop gains. Embodiments of the present invention are directed to CFA circuits that generate CM currents. Embodiments of the present invention are also related to CFA circuits that generate DM currents. Further embodiments of the present invention are related to fully differential CFA circuits with separate CM and DM inputs. Such amplifier circuits combine the benefits of CFA designs, such as high slew rate and insensitive bandwidth, with independent control of DM and CM signals.

Further embodiments, and the features, aspects, and advantages of the present invention will become more apparent from the detailed description set forth below, the drawings and the claims.

DETAILED DESCRIPTION

As mentioned above, it is a desired to have the ability to tune the CM and DM paths of an amplifier circuit independently. One possible way to address this issue is with independent compensation of DM and CM signals, as described in U.S. patent application Ser. No. 10/657,447, entitled "Common-Mode and Differential-Mode Compensation for Operational Amplifier Circuits," filed Sep. 8, 2003, which is incorporated by reference herein. The aforementioned Patent Application addresses the problem of CM vs. DM stability, but does not explicitly provide for separate control of the DM & CM voltages.

A more effective and traditional scheme is to use a fully differential op-amp architecture. An example of such an approach would be the standard folded-cascode voltage-feedback differential amplifier. However, the standard folded-cascode voltage-feedback differential amplifier does not provide the unique advantages of a CFA architecture, such as insensitivity of bandwidth to closed-loop gain and large slew rate at small supply currents.

Figure 4A:
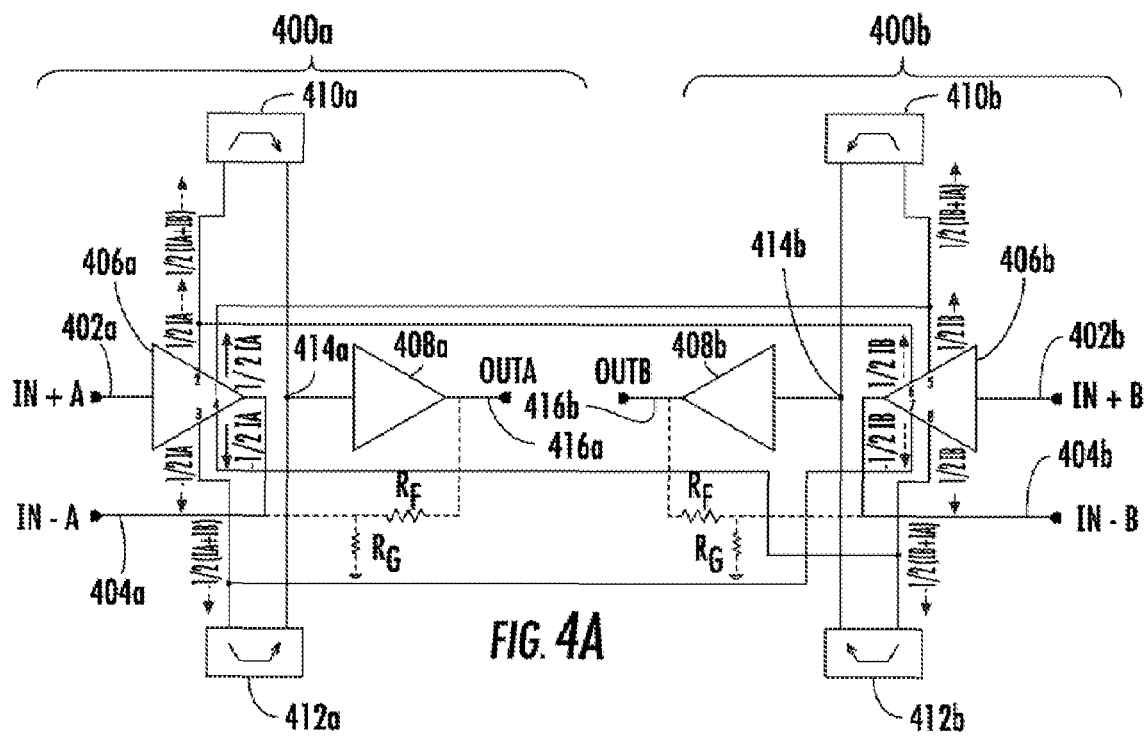
FIGS. 4A and 4B are high level circuit diagrams illustrating common-mode (CM) current feedback amplifier circuits that amplify common-mode (CM) signals using the generation of CM currents.
Figure 5:
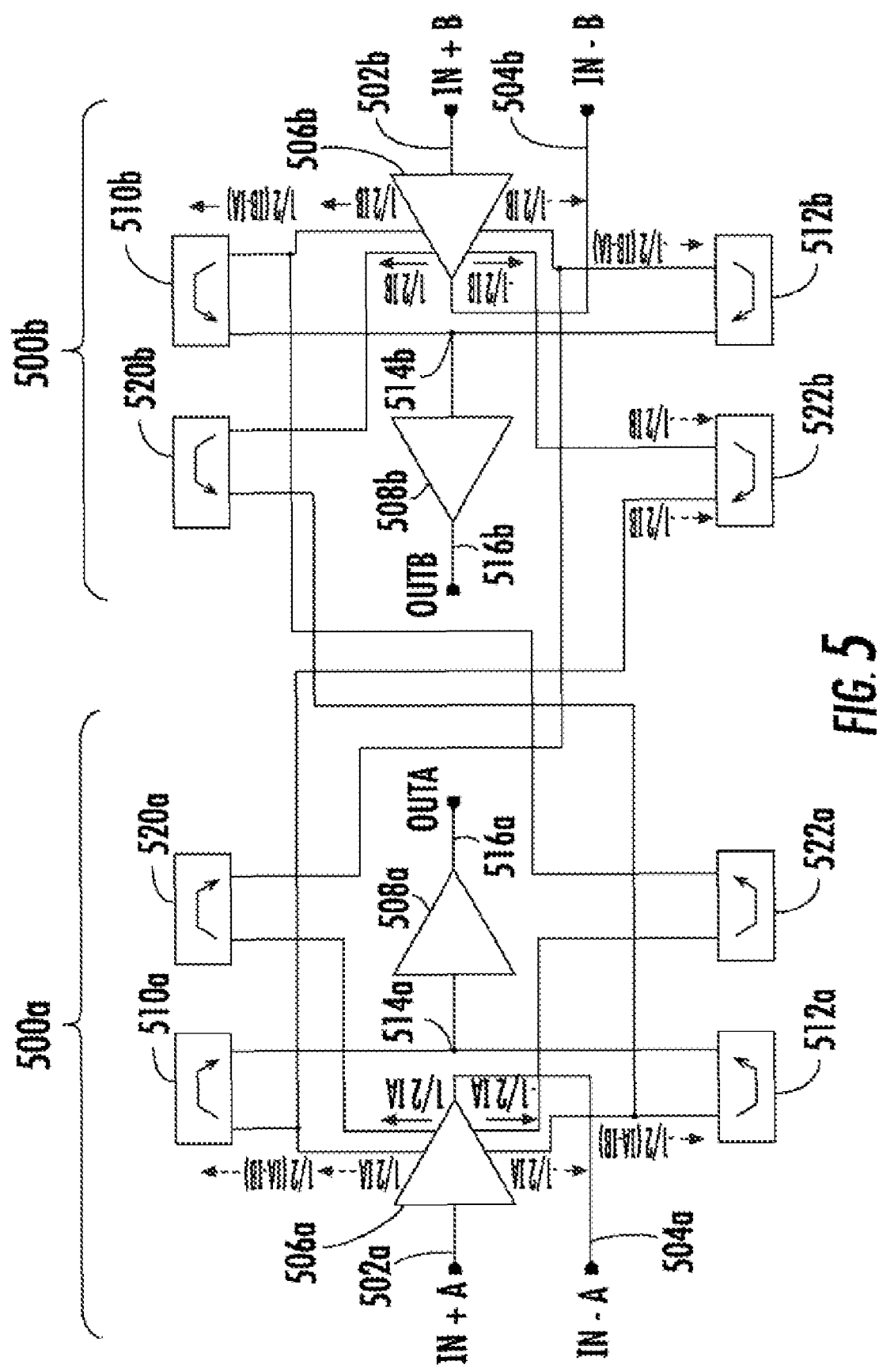
FIG. 5 is a high level circuit diagram illustrating differential-mode (DM) current feedback amplifier circuit that amplifies differential-mode (DM) signals using the generation of DM currents.

In order to make a CM or DM current-feedback loop, by definition there should exist the ability to generate currents that are proportional to either the sum or difference of the input signals. These currents then become the inputs to the current mirrors of a CFA configuration. Adding and subtracting currents is possible with the use of parallel currents and current mirrors. FIGS. 4A and 5 are high level circuit diagrams illustrating how the CM and DM currents can be generated, in accordance with embodiments of the present invention. Implementations of FIGS. 4A and 5 are discussed below, respectively, with reference to FIGS. 6 and 7. Other implementations are also within the spirit and scope of the present invention.

Figure 1A:
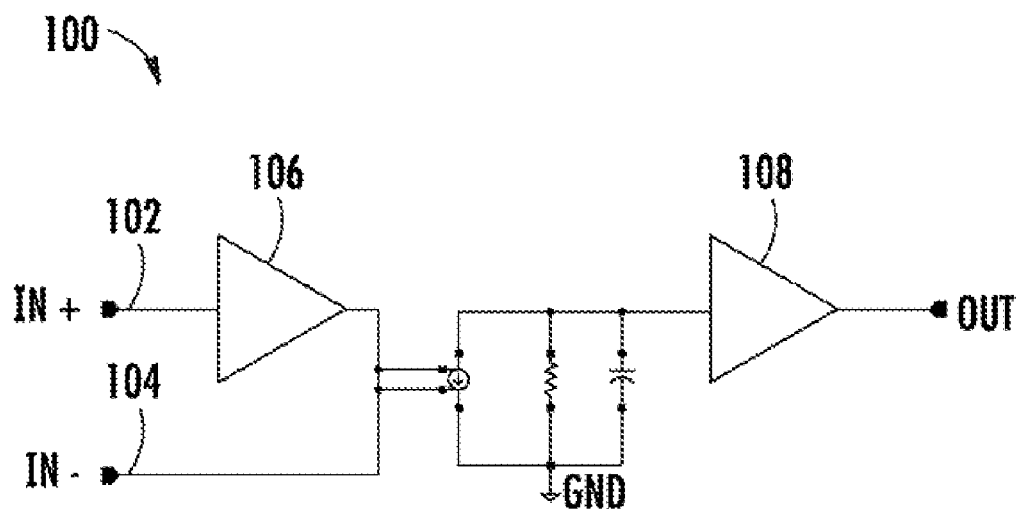
FIG. 1A is a macro level diagram of a basic CFA.
Figure 1B:
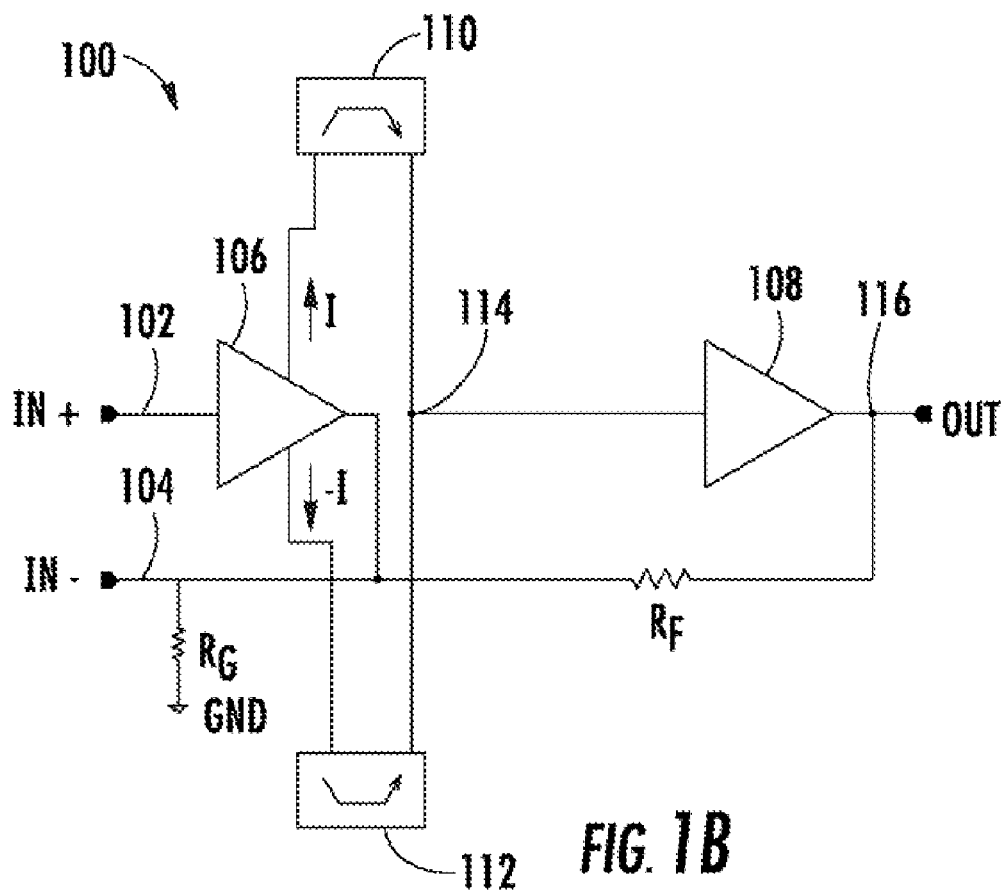
FIG. 1B is a high level circuit diagram that is useful for describing the basic operation of a CFA.
Figure 2:
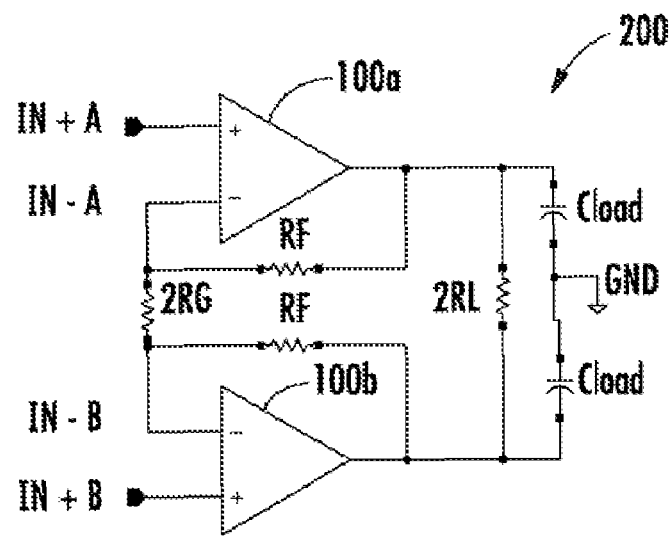
FIG. 2 is a high level circuit diagram showing a symmetrical pair of CFAs hooked up in a standard differential gain configuration to form a differential configuration of two amplifiers.
Figure 3A:
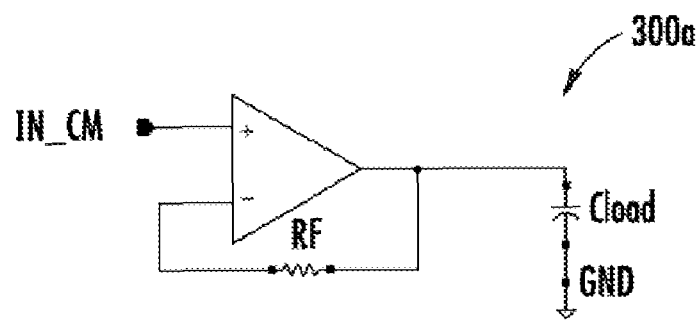
FIGS. 3A and 3B are high level circuit diagrams of two half-circuits that provide the ability to analyze the differential circuit of FIG. 2 in terms of two signal paths, one for DM signals and one for CM signals.
Figure 3B:
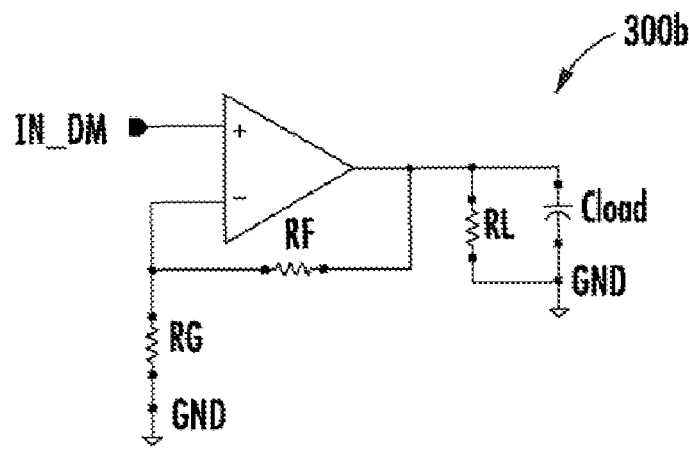

Referring now to FIG. 4A, input voltage buffers 406a and 406b of two CFAs 400a and 400b are configured such that supply currents are split into two equal parts. The CFA 400a includes an input voltage buffer 406a, a pair of current mirrors 410a and 412a, and an output buffer 408a. When a voltage is applied to a non-inverting input 402a of the input voltage buffer 406a, it is immediately buffered to an inverting input 404a. A feedback resistor $R_F$ connects the OUTA to IN–A (in a similar fashion as shown in FIG. 1B), and a feedback resistor $R_F$ connects the OUTB to IN–B. Assuming a standard non-inverting op-amp configuration, this voltage causes a change in the current flowing through the feedback resistors, and optional gain resistors. The input voltage buffer 406a must supply this current; therefore it must flow through current mirrors 410a and 412a and is duplicated, causing a ΔI to be applied to a high-impedance node 414a. This current, flowing into the high impedance node 414a, causes a change in voltage that is then transferred to a first output 416a (OUTA) by an output buffer 408a. CFA 400b, which includes elements labeled in a similar manner (but with the suffix "b" instead of "a") operates in a similar manner to CFA 400a. Also shown in FIG. 4A are optional gain resistors $R_G$.

By wiring ½ of the supply current $I_A$ of buffer 406a in parallel with ½ of the supply current $I_B$ from the opposite buffer 406b, a CM current is generated. Explicitly, with the inputs denoted A and B, and the current generated by the two inputs buffers 406a and 406b labeled $I_A$ and $I_B$, respectively, then the current sensed by each of the CFA's 400a and 400b can be expressed as $I_{CM}=\frac{1}{2}(I_A+I_B)$. This is the definition of a CM signal; if A and B are equal then $I_{CM}=I_A=I_B$, whereas if A and B are DM, that is to say equal in magnitude but opposite in phase, $I_A=-I_B$ and $I_{CM}=0$. Accordingly, the circuit of FIG. 4A admits and amplifies CM signals, and rejects DM signals. The various currents generated by each input buffer 406a and 406b, such as ½ ($I_A+I_B$), are proportional to a difference between an input voltage signal provided to a non-inverting input of the amplifier circuit (formed by the input buffer) and a fraction of its associated output voltage signal.

Figure 4B:
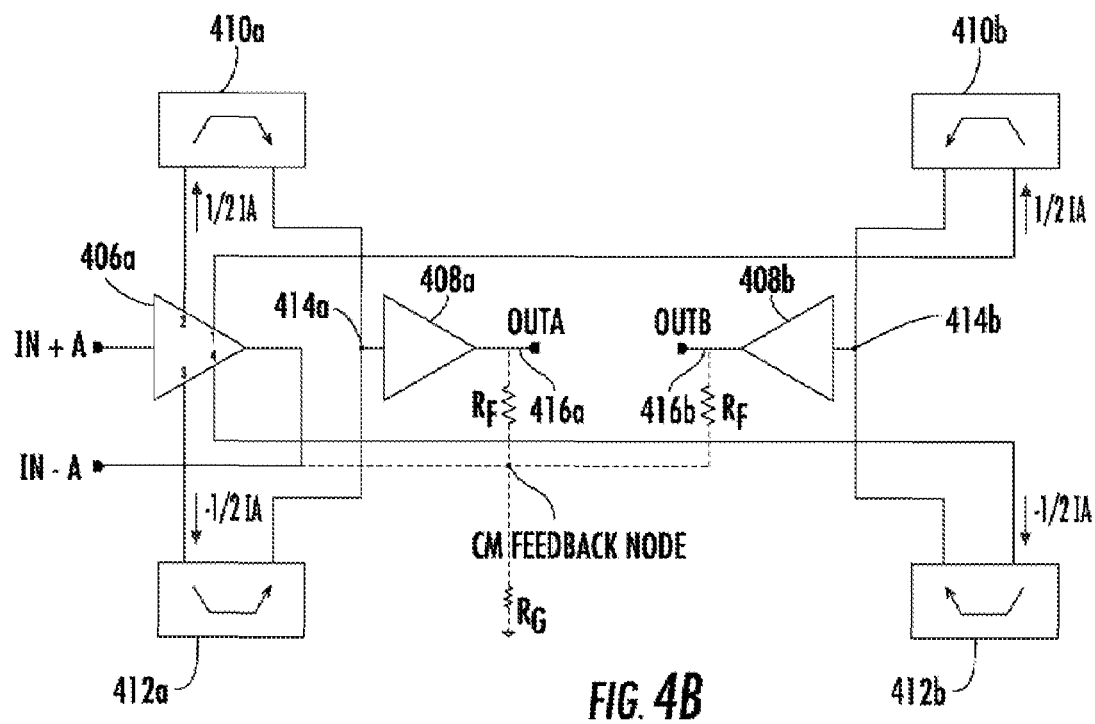

The circuit of FIG. 4A shows two single-ended inputs, labeled IN+A and IN+B, that will in general not be equal to each other. Therefore, there may be a DM signal that needs to be cancelled out in order to provide CM operation. However, a CM input signal can be guaranteed by shorting together input nodes 402a (IN+A) and 402b (IN+B). By doing so, the two independent inputs are replaced with a single input which is inherently CM. In such a case, the currents and voltages of the CFA 400a and the CFA 400b would be identical, and therefore portions of the circuit can be eliminated without loss of functionality. For example, the input buffer 406b can be eliminated. This may be desirable in order to reduce the design's complexity and cost. The resulting circuit, with input buffer 406b eliminated, is shown in FIG. 4B.

Referring now to FIG. 5, in a similar manner as in FIG. 4A, input voltage buffers 506a and 506b of two CFAs 500a and 500b are configured such that supply currents are split into two equal parts. The various currents generated by each input buffer 506a and 506b, such as ½$I_A$, are proportional to a difference between an input voltage signal provided to a non-inverting input of the amplifier circuit (formed by the input buffer) and a fraction of its associated output voltage signal. FIG. 5 demonstrates the generation of DM currents by using current mirrors to invert ½ of the buffer current before it is added together. This means that the current sensed can now be expressed as $I_{DM}=\frac{1}{2}(I_A-I_B)$. When A and B are CM, then $I_{DM}$ will equal zero, whereas when A and B are DM, $I_A=-I_B$ and therefore $I_{DM}=I_A=-I_B$. Accordingly, the circuit of FIG. 5 admits and amplifies DM signals, and rejects CM signals. In the specific embodiment shown in FIG. 5, eight current mirrors 510a, 520a, 512a, 522a, 510b, 520b, 522b and 512b are used. A first group of the current mirrors (i.e., current mirrors 510a, 512a, 510b and 512b) are used for adding currents together, and providing the added currents to high impedance nodes (i.e., nodes 514a and 514b). A second group of the current mirrors (520a, 522a, 520b and 522b) are used to provide mirrored versions of currents to the first group of current mirrors where they can be added as appropriate. A feedback resistor $R_F$ (not shown, for simplicity) connects the OUTA to IN–A (in a similar fashion as shown in FIGS. 1B and 4A), and a feedback resistor $R_F$ (not shown, for simplicity) connects the OUTB to IN–B.

Figure 6:
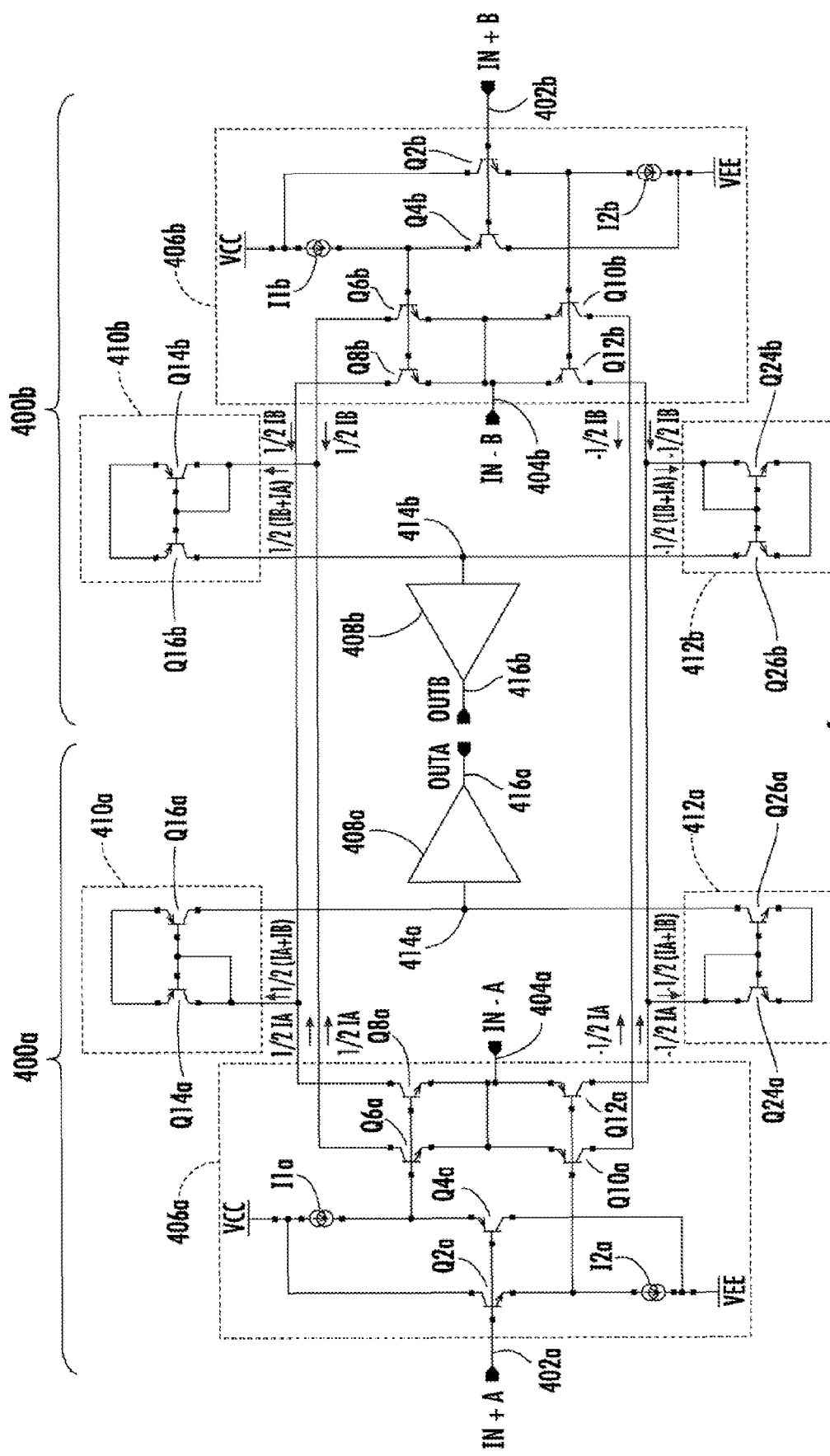
FIG. 6 shows circuitry implementing the diagram of FIG. 4A using bipolar transistors, according to an embodiment of the present invention.
Figure 7:
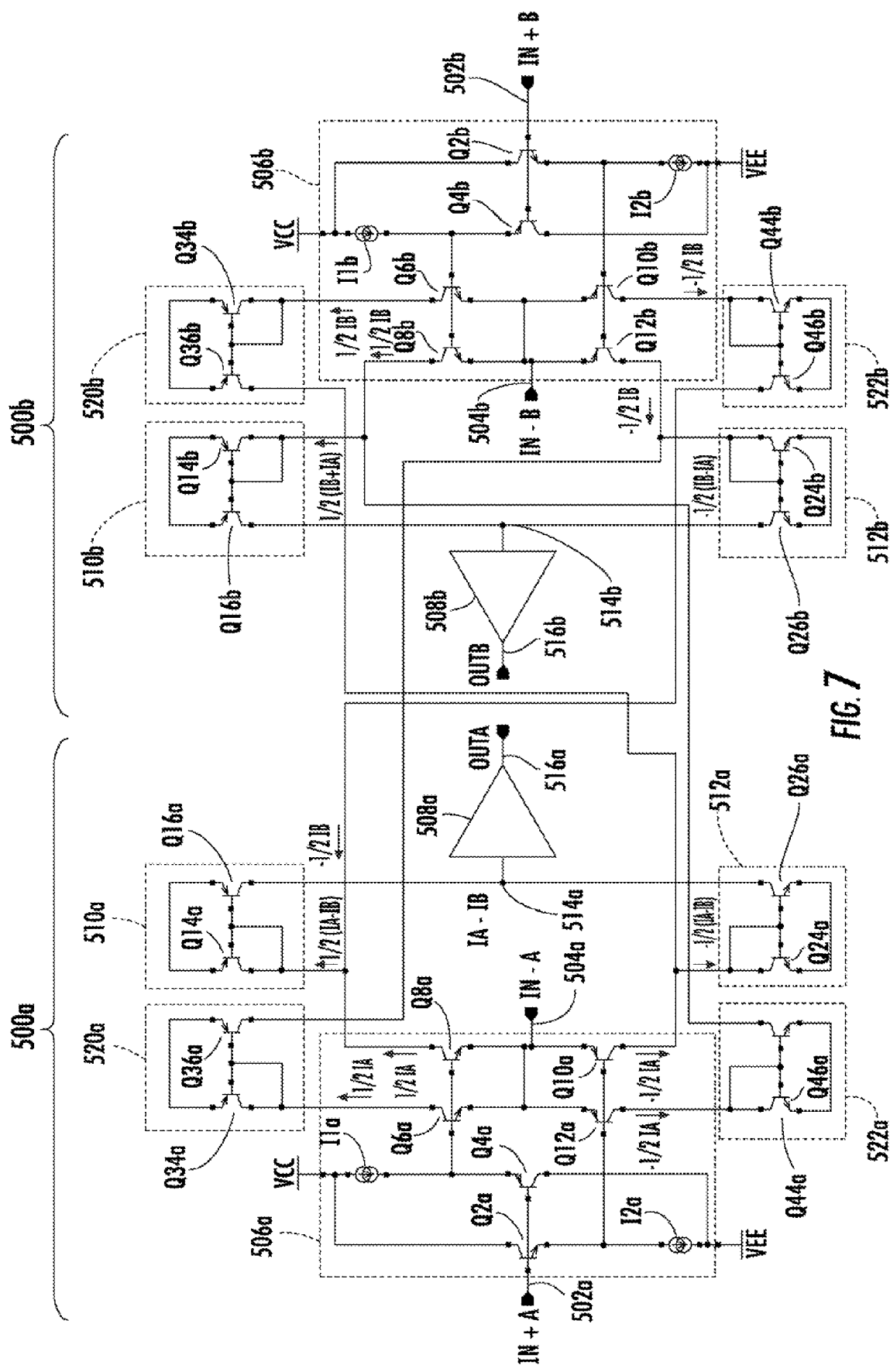
FIG. 7 shows circuitry implementing the diagram of FIG. 5 using bipolar transistors, according to an embodiment of the present invention.

FIGS. 6 and 7 show implementations, according to embodiments of the present invention, of the concepts of FIGS. 4A and 5, respectively. Bipolar transistors and non-degenerate current mirrors are used for simplicity. However, it is within the scope of the present invention that the bipolar transistors shown in the Figures can be replaced with other transistors, such as but not limited to, metal-oxide semiconductor (MOS), metal semiconductor (MES) or field effect (FET) transistors with similar behavior. Additionally, the use of alternative types of current mirrors are within the spirit and scope of the present invention, as would be appreciated by one or ordinary skill in the art.

Referring to FIG. 6, the input voltage buffer 406a is shown as including NPN transistor Q2a and PNP transistor Q4a having common bases forming the non-inverting input IN+A of the input voltage buffer 406a, which is applied to the non-inverting input IN+A of the CFA 400a. The NPN transistor Q2a has its collector connected to a power supply rail Vcc, and its emitter connected through a current source I2a to a power supply rail Vee. The PNP transistor Q4a has its collector connected to the power supply rail Vee, and its emitter connected through a current source I1a to the power supply rail Vcc. The emitters of NPN transistor Q8a and PNP transistor Q12a form the output 404a of the input voltage buffer 406a, which is applied to the inverting input IN−A of the CFA 400a. NPN transistor Q8a and PNP transistor Q12a are connected in an emitter follower configuration with the collector of transistor Q8a connected to an input terminal of the current mirror 410a, and the collector of transistor Q12a connected to an input terminal of the current mirror 412a. The outputs of the current mirrors 410a and 412a are connected to form the gain node 414a. The gain node 414a is connected to an input of the output buffer 408a. The output 416a of the output buffer 408a forms the output OUTA of the CFA 400a.

The input voltage buffer 406a also includes NPN transistor Q6a and PNP transistor Q10a, which are connected in a similar manner as transistors Q8a and Q12a. More specifically, NPN transistor Q6a and PNP transistor Q10a are also connected in an emitter follower configuration, with their emitters connected to the emitters of transistors Q8a and Q12a, which form the inverting input IN−A of the CFA 400a. However, rather than the collectors of transistors Q6a and Q10a being connected, respectively, to the inputs of current mirrors 410a and 412a, the collector of transistor Q6a is connected to the input of current mirror 410b, and the collector of transistor Q10a is connected to the input of current mirror 412b. In the above manner, the collector of transistor Q8a provides $½I_A$ to the input of current mirror 410a, which also receives $½I_B$ provided by the collector of transistor Q6b. The collector of transistor Q6a provides $½I_A$ to the input of current mirror 410b, which also receives $½I_B$ provided by the collector of transistor Q8b.

The input voltage buffer 406b, which provides the non-inverting input IN+B and the inverting input IN−B, includes a similar topology as buffer 406a. Accordingly, buffer 406b is labeled in the same manner as buffer 406a (except the suffix "a" is replaced with the suffix "b"), and thus need not be described in additional detail. As mentioned above, alternative topologies for the buffers can be used, while still being within the scope of the present invention.

The current mirror 410a is shown as including PNP transistors Q14a and Q16a having their bases connected together and their emitters connected together. The collector of transistor Q14a, which is connected to its base, forms an input of the current mirror 410a. The collector of transistor Q16a forms an output of the current mirror 410a. In this embodiment, the input of the current mirror 410a receives current $½I_A$ from input voltage buffer 406a, and current $½I_B$ from input voltage buffer 406b, and thus receives $½(I_A+I_B)$, and provides that current to high impedance node 414a. The other current mirrors 410b, 412a and 412b are shown as being implemented in a similar manner, and thus need not be described in detail. As mentioned above, alternative topologies for the current mirrors can be used, while stilling being within the scope of the present invention. The operation of the circuit of FIG. 6 was described above in the description of FIG. 4A.

Referring now to FIG. 7, the input voltage buffers 506a and 506b are shown as being implemented in a similar manner as buffers 406a and 406b in FIG. 6, and are thus labeled in a similar manner. Further, current mirrors 510a, 512a, 510b, and 512b are shown as being implemented in a similar manner as currents mirrors 410a, 412a, 410b and 412b, and thus are labeled in a similar manner. The remaining current mirrors 520a, 522a, 520b and 522b are also shown as being implemented in a similar manner, and thus need not be described in additional detail. The operation of the circuit of FIG. 7, was described above in the description of FIG. 5.

Embodiments of the present invention are also directed to combinations of the CM and DM types of current generators that were described above with reference to FIGS. 4-7. These current generators can be combined, in accordance with embodiments of the present invention, to obtain whatever mix of CM and DM control desired. Below, there is a discussion of specific architectures that can be obtained, in accordance with embodiments of the present invention.

Architectures and Implementations:

Embodiments of the present invention are also directed to architectures that include combinations of current feedback, voltage feedback, CM and DM signals. Embodiments of the present invention are also directed to implementations of such architectures. In the implementations described below, bipolar transistors are shown. However, alternative types of transistors, such as but not limited to, metal-oxide semiconductor (MOS) or metal semiconductor (MES) transistors with similar behavior, can be used, and are thus within the spirit and scope of the present invention, as would be appreciated by one or ordinary skill in the art. As with FIGS. 5-7, for simplicity, the external feedback and gain resistors are not shown in FIGS. 8-10.

The Fully Differential CFA:

By implementing two independent input stages, one using the CM current-generating strategy and the other using the DM current generator strategy, the generated currents can be added together to create classic fully differential functionality, where the DM and CM can be independently and simultaneously controlled.

Figure 8:
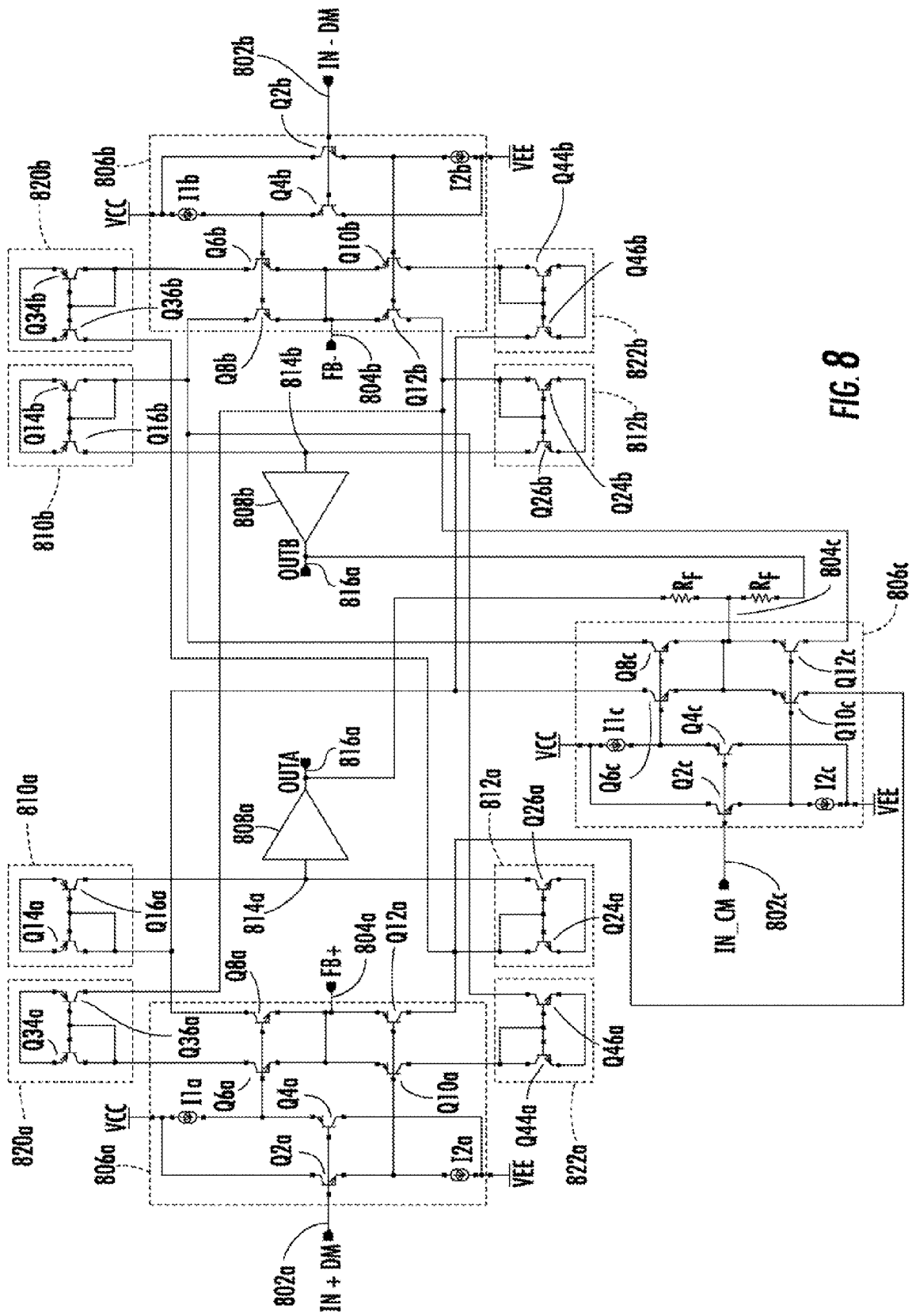
FIG. 8 shows circuitry implementing a fully differential current feedback amplifier (CFA) circuit with separate common-mode (CM) and differential-mode (DM) inputs, according to an embodiment of the present invention.

FIG. 8 demonstrates a straightforward implementation of a fully differential CFA circuit, including DM input buffers 806a and 806b, output buffers 808a and 808b, current mirrors 810a, 812a, 820a, 822a, 810b, 812b, 820b and 822b, and an independent CM input buffer 806c. The input buffers' supply current is explicitly duplicated by the use of parallel output devices, and the signal-inverting current mirrors are explicit and separate from the gain-stage mirrors of the rest of the amplifier. Note the use of simple current mirrors and buffers, but of course actual designs might use fancier topologies such as degenerated Wilson mirrors, or mirrors using emitter inputs and both sexes of transistor, etc.

As mentioned above in the discussion of FIGS. 4A and 4B, a CM input signal can be guaranteed by shorting together input nodes 402a and 402b. By doing so, the two independent inputs are replaced with a single input which is inherently CM. In such a case, the currents and voltages of the CFA 400a and the CFA 400b would be identical, and therefore portions of the circuit can be eliminated without loss of functionality to reduce the design's complexity and cost (e.g., in FIG. 4A, input buffer 406b can be eliminated). The fully differential architecture of FIG. 8 demonstrates this principle in operation. The input labeled "IN_CM" goes into the buffer 806c, which provides identical (and thus, CM) currents into both sides of the circuit. CM feedback is provided using current feedback resistors $R_F$, which presents the output of buffer 806c with the average of the two output voltages (outputs of buffers 808a and 808b). Meanwhile, differential signals are provided by the input buffers 806a and 806b together with current mirrors 810a, 812a, 810b and 822b. The output of this circuit will be a sum of the DM and CM signals: (OUTA−OUTB)=GAIN_DM*(IN+DM− IN−DM); and ½(OUTA+OUTB)=GAIN_CM*(IN_CM), where GAIN_DM and GAIN_CM are the closed-loop gains of the differential and common mode feedback loops, respectively. The GAIN_DM and GAIN_CM are set by feedback resistors $R_F$ and optional gain resistor $R_G$.

Figure 9:
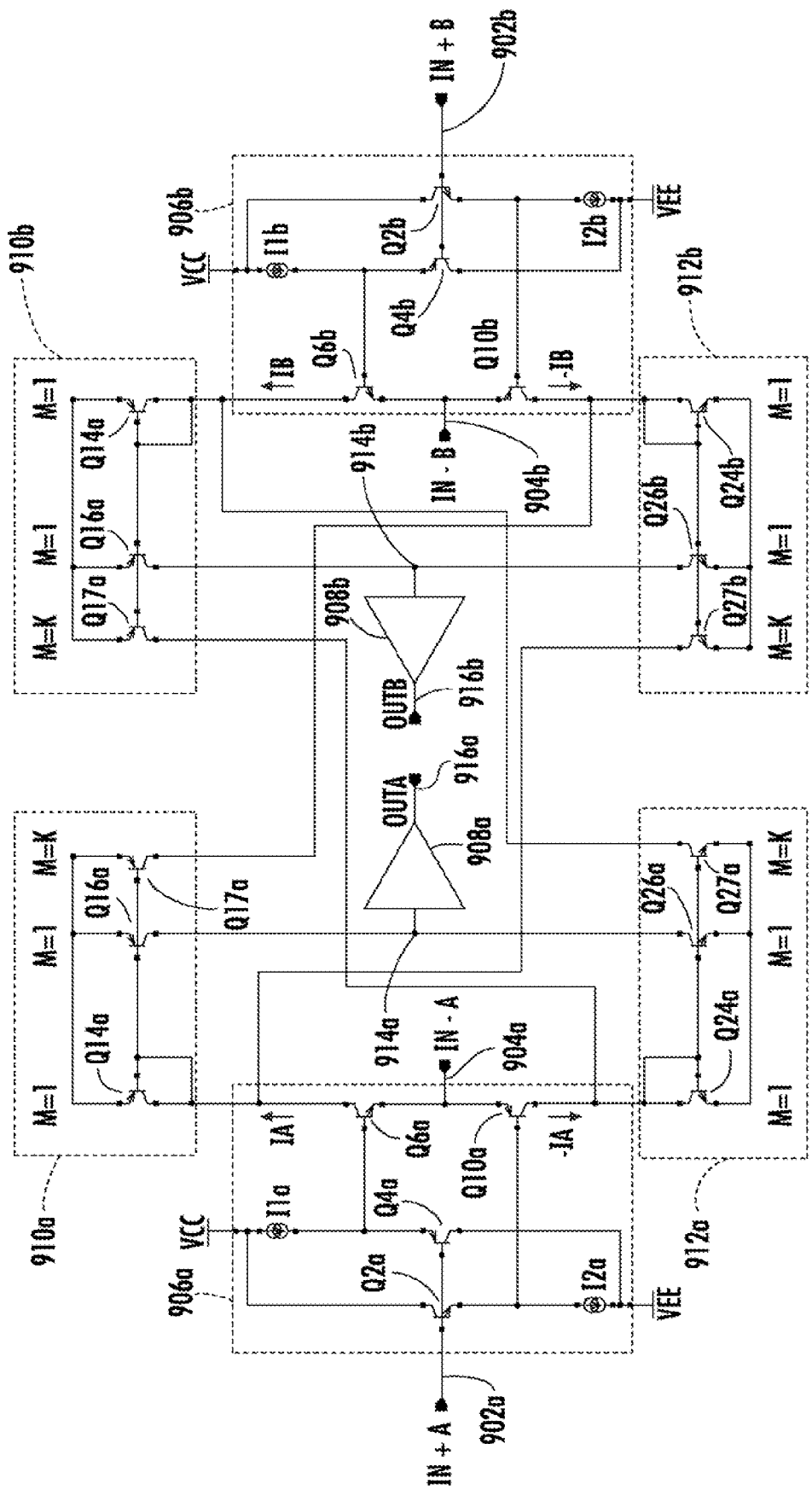
FIG. 9 shows circuitry for implementing a partial cancellation differential-mode (DM) current feedback amplifier circuit, according to an embodiment of the present invention.

The "Partially Cancelled" CFA:

By using the scheme of FIG. 5, but not canceling the current 100%, the CM current signal can be attenuated with respect to the DM signal, in accordance with an embodiment of the present invention. For example, if the current mirrors used to invert the signal in FIG. 5 were to have a current gain of 2:1, rather than 1:1, then the canceling signal would be equal to ½ of ½ the input buffer current, and $I_{total}(A) = ½I_A − ¼I_B = ¾I_{DM} + ¼I_{CM}$. Therefore, the effective transconductance and gain of the DM will about three times as much as the CM. If independent control of the CM is not required and the desire is simply to damp out an undesired CM signal, this scheme (an embodiment of which is shown in FIG. 9) is simpler and less costly to implement than the fully differential strategy mentioned above. Note that it is possible to just as easily implement partial CM so that the DM is attenuated with respect to the CM.

Referring now to FIG. 9, the partial cancellation embodiment is shown as including input buffers 906a and 906b, multiple output current mirrors 910a, 910b, 912a and 912b, and output buffers 908a and 908b. FIG. 9 demonstrates an embodiment whereby the differential current is generated without the need for separate buffer output devices and current mirrors, thus saving component count and overall cost. Instead, the main gain mirrors of the amplifier, which now have multiple outputs, perform the task of duplicating and inverting the supply signal. The potential drawback to this embodiment is that the input currents to the gain mirrors of each amplifier are now coupled as follows:

$$I_{IN}(A) = I_A + K \cdot I_{IN}(B) \qquad \text{I.}$$

$$I_{IN}(B) = I_B + K \cdot I_{IN}(A) \qquad \text{II.}$$

Where K is the current gain of the extra output on the gain mirror    III.

Assuming the presence of a CM signal such that $I_A = I_B = I_{CM}$, and solving for $I_{IN}$, $I_{IN} = I_{CM}(1+K)/(1−K^2)$. Therefore, when total cancellation of the differential mode is attempted, K→1 and $I_{IN} \to \infty$, which is an undesirable result. Therefore, this circuit will be limited to "partially cancelled" CFA's as described above.

More specifically, when comparing FIG. 9 to FIG. 6, it can be seen that the input buffer 906a is implemented without transistors Q8a and Q12a, and the input buffer 906b is implemented without transistors Q8b and Q12b. Thus, the currents produced by the buffer 906b are not halved, causing IA (not ½IA) to be provided to the input of the current mirror 910a, and −IA (not −½IA) to be provided to the input of the current mirror 912a. The various currents generated by each input buffer 906a and 906b, such as $I_A$ and $I_B$, are proportional to a difference between an input voltage signal provided to a non-inverting input of the amplifier circuit (formed by the input buffer) and a fraction of its associated output voltage signal.

To create a second output for each current mirror, an additional transistor is added to each current mirror. For example, in current mirror 910a, a transistor Q17a is added, with its base connected to the bases of transistors Q16a and Q14a, its emitter connected to the emitters of transistors Q16a and Q14a, and its collector forming the second output of the current mirror. The first output of the current mirror 910a (the collector of transistor Q16a) outputs IA, and the second output of the current mirror 910a (the collector of transistor Q17a) outputs K•IA, where K, which is less than 1, is dependent on the size of the transistor Q17a.

Various Implementations for Generating Sums and Differences of Current

The above discussed circuit of FIG. 8 presented an implementation of a fully differential CFA architecture. Alternative schemes for generating sums and differences of currents using current mirrors are also within the scope of the present invention. Such alternative schemes use both the input & output of a mirror. FIGS. 10A-10D demonstrate various implementations of this concept. In all cases, currents combined in parallel at the input side of a current mirror add together, while currents taken away from the output side serve to subtract from the total output current.

Figure 10B:
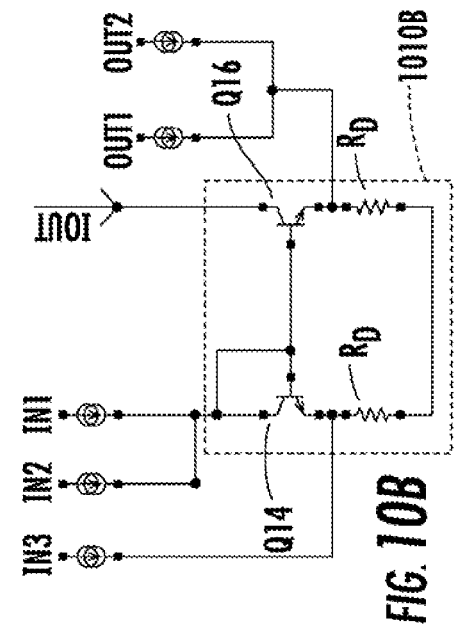
FIGS. 10A-10D show various circuitry for generating sums and differences of current using current mirrors.
Figure 10D:
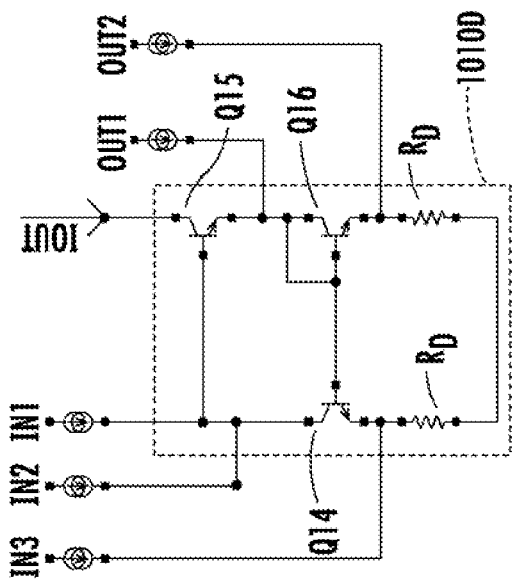
Figure 10A:
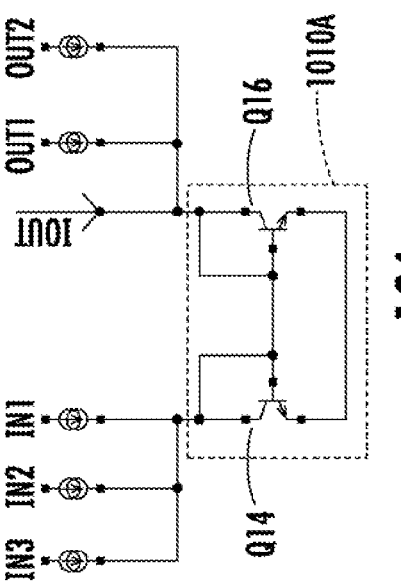

FIG. 10A presents a basic current mirror 1010A, showing three currents being added together (IN1, IN2, IN3) and two currents being subtracted from the output (OUT1, OUT2). The total output current will be given approximately by:

$$IOUT = IN1 + IN2 + IN3 − OUT1 − OUT2$$

Any number of currents could be combined in such a fashion. The limitation of FIG. 10A is that the output node of the mirror (in this implementation, the collector of the output transistor Q4) may experience large variations in voltage, and this may disrupt the correct functioning of output current source OUT1, OUT2, etc.

In order to avoid this effect, a slightly more complicated current mirror 1010B with degeneration resistors ($R_D$) attached to the emitters (of transistors Q14 and Q16), as shown in FIG. 10B, can be employed. This circuit is superior in that variations on the output voltage of the current mirror do not affect the voltage seen by the subtracting current sources at the output. Note that the input currents can be added in a similar fashion, at the emitter terminal of the input transistor Q14, as demonstrated with IN3. This circuit has the drawback that the currents through the transistors will no longer match precisely, and therefore some nonlinearity may be introduced.

Figure 10C:
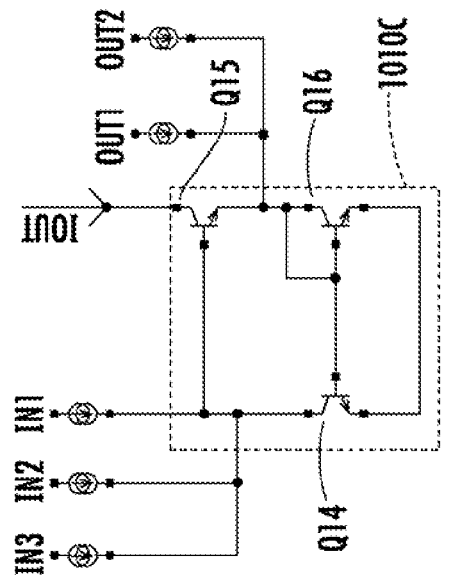

This problem can be ameliorated with an additional cascode transistor Q15, as demonstrated in the modified Wilson current mirror 1010C of FIG. 10C.

Finally, both a cascode transistor Q15 on the output and degeneration resistors RD could be used, with inputs & outputs connected at a number of possible nodes as shown in the current mirror 1010D of FIG. 10D.

This is not an exhaustive list of possibilities, but shows some of the more common current mirrors typically implemented in integrated circuits. Accordingly, one of ordinary skill in the art will understand that alternative current mirror circuits can be used for adding and subtracting currents, while still being within the spirit and scope of the present invention.

Alternative Fully Differential CFA

Figure 11:
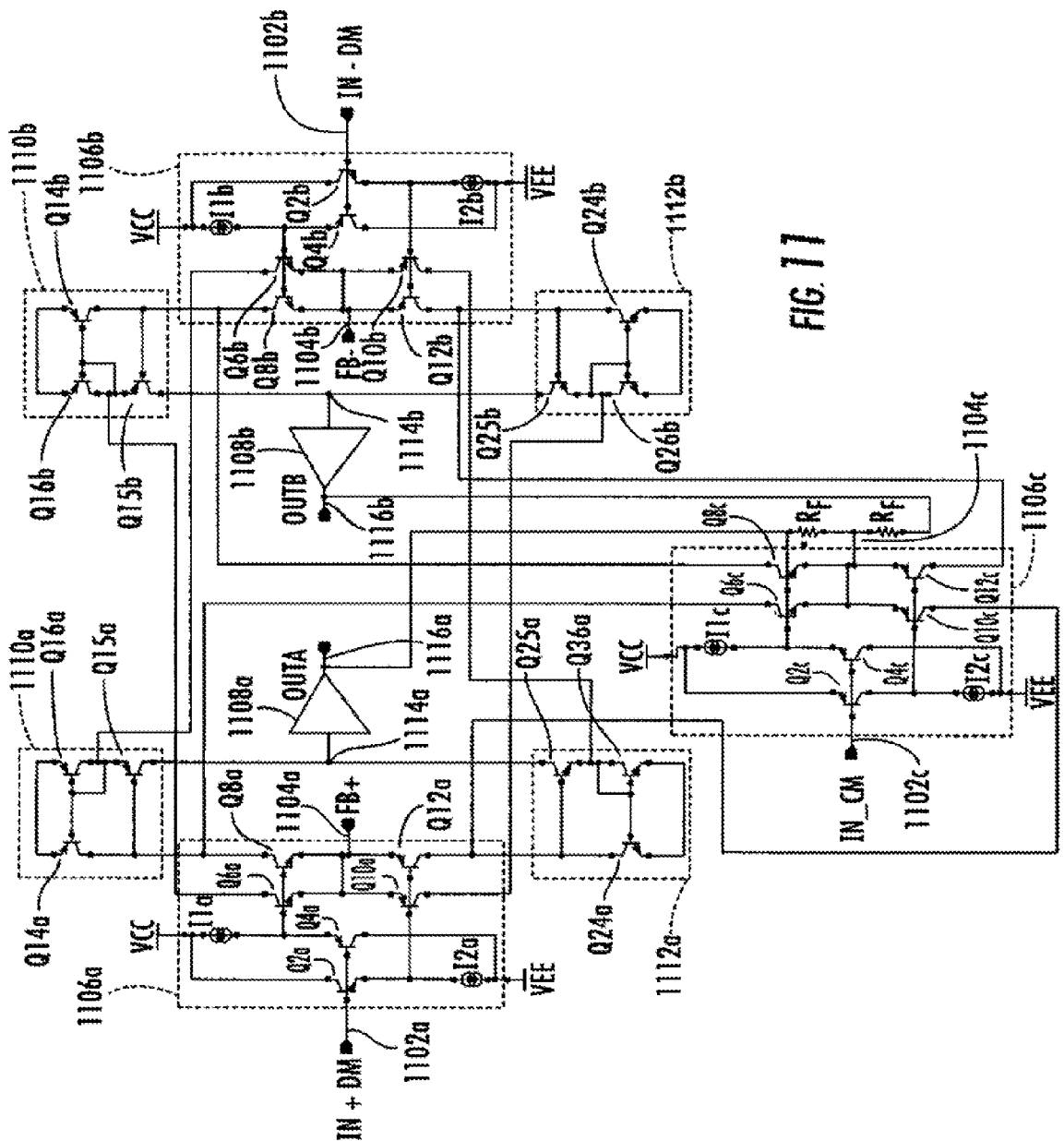
FIG. 11 shows circuitry that generates CM and DM currents using multiple buffer currents, but with less current mirrors than shown in FIG. 8, according to an embodiment of the present invention.

The circuit of FIG. 11 implements a fully differential CFA using cascoded Wilson current mirrors (which were discussed above with reference to FIG. 10C), in accordance with an embodiment of the present invention. Rather than using an extra set of current mirrors to generate inverted currents, as in FIG. 8, the circuit of FIG. 11 uses direct subtraction via connection to the outputs of the main gain mirrors.

The embodiment of FIG. 11 includes input buffers 1106a and 1106b, cascoded Wilson current mirrors 1110a, 1112a, 1110b and 1112b, output buffers 1108a and 1108b, and CM input buffer 1106c. FIG. 11 demonstrates an embodiment for generating CM and DM signal currents that require multiple buffer currents, but does not require additional current mirrors. The subtraction function required for DM operation is performed by taking away current from the output of the gain-node current mirrors, rather than trying to inject the correct phase into the input. The benefit is once again a reduction of the circuitry required. A second potential benefit is that this scheme may allow higher frequency operation, since there is no additional phase shift added by extra current mirror stages. A potential drawback could be that since this architecture involves connecting extra circuitry to the gain node side of the current mirrors, it could result in decreased gain and/or greater nonlinearity which should be compensated for. However, so long as these issues are appropriately addressed, FIG. 11 provides an excellent implementation.

Figure 12:
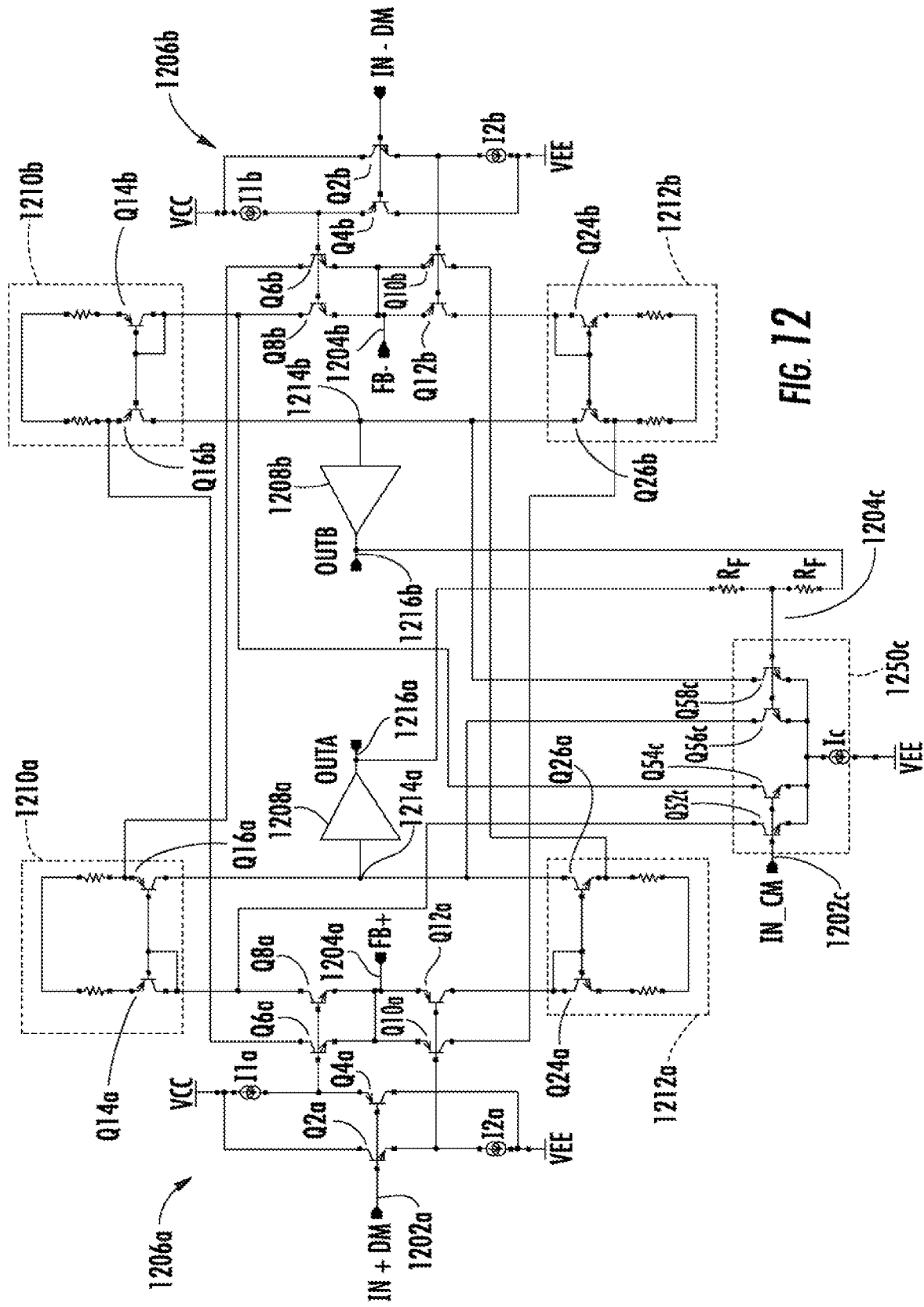
FIG. 12 shows circuitry for implementing a hybrid CFA/VFA, according to an embodiment of the present invention.

Hybrid CFA/VFA Combinations:

There is no particular reason that there is a requirement to use a CFA input for both CM and DM signals. It is possible, for example, to use the DM CFA input of FIG. 5, but generate a common-mode signal using a (somewhat modified) standard differential pair. This would make the DM a CFA, and the CM a voltage feedback amplifier (VFA). There are various reasons why this may be desirable. For example, there may be no need for the special characteristics of a CFA for the CM. For another example, it might be desirable to have a small voltage offset or bias current on the CM, or perhaps the CFA requirement for an external feedback resistor is undesirable. The VFA input might be simpler and less costly to implement. FIG. 12 shows a block diagram of such a hybrid voltage-feedback/current-feedback design.

The circuit of FIG. 12, which implements a hybrid CFA/VFA, is shown as using the simple degenerated mirrors of FIG. 10(B). It also demonstrates a voltage-controlled common-mode feedback circuit, to demonstrate that the differential and common-mode portions of the overall architecture can be combined with other types of amplifier architecture in hybrid circuits.

Referring now to FIG. 12, in this particular example the CM circuit of FIG. 10 has been replaced with a voltage feedback circuit (VFC), while the DM circuit is similar to that used in FIG. 11. The new CM circuitry performs the same task as before, namely providing identical currents to the left and right halves of the circuit. However, rather than using a voltage buffer as an input stage, the CM circuit of FIG. 12 uses a differential pair circuit 1250c. The CM current is therefore dependent on the difference between the voltage at the IN_CM input node and the voltage at a CM feedback node 1252c. This means that the CM circuit is now operating in a voltage-feedback mode rather than the current-feedback mode of FIG. 11. Of particular note in FIG. 12 is the fact that the differential pair circuit 1250c has multiple outputs. Additionally, in FIG. 12, the two pairs of outputs are connected such that at steady state, the currents will be balanced equally in both sides of the differential pair circuit 1250c, which is a desirable condition for optimal voltage-feedback operation.

Specifically, the differential pair circuit 1250c is shown as including four NPN transistors labeled Q52c, Q54c, Q56c and Q58c. The bases of transistors Q52c and Q54c are connected together and form the CM input (CM_IN) 1202c. The emitters of transistor Q52 and Q54, which are connected together, are connected through a current source Ic to the rail voltage VEE. The bases of transistors Q56c and Q58c, which are connected together, form a second input 1204c of the differential pair circuit 1250c, which is connected to OUTA and OUTB by feedback resistors $R_F$. The bases of transistors Q56c and Q58c, which are connected together, are connected through the current source Ic to the rail voltage VEE. Transistors Q52c and Q54c provide the CM voltage-feedback current, while transistors Q56c and Q58c remove CM current from (or provide a current of opposite polarity to) the high-impedance nodes 1214a and 1214b, and therefore at steady state the current through all four transistors Q52c, Q54c, Q56c and Q58c should be equal. One of ordinary skill in the art would appreciate that the differential pair circuit 1250c could be implemented in other manners that are also within the spirit and scope of the present invention.

For convenience, identical or similar components in the various Figures have been labeled in a similar manner (i.e., the last two number are the same). For example, one of the input buffers is labeled 406a in FIGS. 4 and 6, 506a in FIGS. 5 and 7, 806a in FIG. 8, 906a in FIG. 9, 1106a in FIG. 11, and 1206a in FIG. 12. For another example, one of the high impedance nodes is labeled 414a in FIGS. 4 and 6, 514a in FIGS. 5 and 7, 814a in FIG. 8, 914a in FIG. 9, 1114a in FIG. 11, and 1214a in FIG. 12. This labeling is useful for understanding similarities, and differences, between the various embodiments.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A current feedback amplifier circuit, comprising:
   a first input buffer (406a) that provides a first non-inverting input (IN+A) of the amplifier circuit, provides a first inverting input (IN−A) of the amplifier circuit, and produces a first plurality of currents;
   a second input buffer (406b) that provides a second non-inverting input (IN+B) of the amplifier circuit, provides a second inverting input (IN−B) of the amplifier circuit, and produces a second plurality of currents;
   first and second high impedance nodes (414a and 414b);
   a plurality of current mirrors to provide currents, proportional to sums of specific currents of the first and second plurality of currents, to the high impedance nodes;

a first output buffer (408a) having an input connected to the first high impedance node (414a), and having an output that provides a first output (OUTA) of the amplifier circuit; and a second output buffer (408b) having an input connected to the second high impedance node (414b), and having an output that provides a second output (OUTB) of the amplifier circuit;

wherein the first plurality of currents are proportional to a difference between an input voltage provided to the first non-inverting input (IN+A) of the amplifier circuit and a fraction of its associated output voltage at the first output (OUTA); and wherein the second plurality of currents are proportional to a difference between an input voltage provided to the second non-inverting input (IN+B) of the amplifier circuit and a fraction of its associated output voltage at the second output (OUTB).

2. The amplifier circuit of claim 1, wherein a feedback resistor connects the first output (OUTA) of the amplifier circuit to the first inverting input (IN−A) of the amplifier circuit.

3. The amplifier circuit of claim 2, wherein a second feedback resistor connects the second output (OUTB) of the amplifier circuit to the second inverting input (IN−B) of the amplifier circuit.

4. The amplifier circuit of claim 3, wherein the first non-inverting input (IN+A) is connected to the second non-inverting input (IN+B).

5. The amplifier circuit of claim 1, wherein the first non-inverting input (IN+A) is connected to the second non-inverting input (IN+B).

6. A current feedback amplifier circuit, comprising:

an input buffer (406a) that provides a non-inverting input (IN+A) of the amplifier circuit, provides an inverting input (IN−A) of the amplifier circuit, and produces a plurality of currents;

first and second high impedance nodes (414a and 414b);

a first plurality of current mirrors that provides mirrored versions of specific ones of the plurality of currents to the first high impedance node (414a);

a second plurality of current mirrors that provides mirrored versions of specific ones of the plurality of currents to the second high impedance node (414b);

a first output buffer (408a) having an input connected to the first high impedance node (414a), and having an output that provides a first output (OUTA) of the amplifier circuit; and a second output buffer (408b) having an input connected to the second high impedance node (414b), and having an output that provides a second output (OUTB) of the amplifier circuit;

wherein the plurality of currents are proportional to a difference between an input voltage provided to the non-inverting input (IN+A) of the amplifier circuit and a fraction of its associated output voltage at the first output (OUTA).

7. The amplifier circuit of claim 6, wherein a feedback resistor connects the first output (OUTA) of the amplifier circuit to the inverting input (IN−A) of the amplifier circuit.

8. The amplifier circuit of claim 7, wherein a second feedback resistor connects the second output (OUTB) of the amplifier circuit to the inverting input (IN−A) of the amplifier circuit.

9. A current feedback amplifier circuit, comprising:

a first input buffer (906a) that provides a non-inverting input (IN+A) of the amplifier circuit, provides an inverting input (IN−A) of the amplifier circuit, and produces a first plurality of currents;

a second input buffer (906b) that provides a second non-inverting input (IN+B) of the amplifier circuit, provides a second inverting input (IN−B) of the amplifier circuit, and produces a second plurality of currents;

first and second high impedance nodes 914a and 914b;

a first output buffer (908a) having an input connected to the first high impedance node (914a), and having an output that provides a first output (OUTA) of the amplifier circuit; and a second output buffer (908b) having an input connected to the second high impedance node (914b), and having an output the provides a second output (OUTB) of the amplifier circuit;

a first plurality of current mirrors each of which includes at least one corresponding input and at least two corresponding outputs; and a second plurality of current mirrors each of which includes at least one corresponding input and at least two corresponding outputs;

wherein two of the outputs of the first plurality of current mirrors are connected to the first high impedance node (914a);

wherein two of the outputs of the second plurality of current mirrors are connected to the second high impedance node (914b);

wherein each of the first plurality of current mirrors receives at one or more input of the current mirror one of the first plurality of currents and a current output by one of the outputs of one of the second plurality of current mirrors; and wherein each of the second plurality of current mirrors receives at one or more input of the current mirror one of the second plurality of currents and a current output by the one of the outputs of one of the first plurality of current mirrors.

10. The amplifier circuit of claim 9, wherein:

the first plurality of currents are proportional to a difference between an input voltage provided to the first non-inverting input (IN+A) of the amplifier circuit and a fraction of its associated output voltage at the first output (OUTA); and the second plurality of current are proportional to a difference between an input voltage provided to the second non-inverting input (IN+B) of the amplifier circuit and a fraction of its associated output voltage at the second output (OUTB).

11. The amplifier circuit of claim 10, wherein for each of the first and second plurality of current mirrors, one of the outputs of the current mirror has a lower current gain than another one of the outputs.

12. The amplifier circuit of claim 9, wherein for each of the first and second plurality of current mirrors, one of the outputs of the current mirror has a lower current gain than another one of the outputs.

13. A current feedback amplifier circuit, comprising:

a first input buffer (1106a) that provides a first DM input (IN+DM) of the amplifier circuit, provides a first feedback node (FB+) of the amplifier circuit, and produces a first plurality of currents;

a second input buffer (1106b) that provides a second DM input (IN−DM) of the amplifier circuit, provides a second feedback node (FB−) of the amplifier circuit, and produces a second plurality of currents;

a third input buffer (1106*c*) that provides a CM input (IN_CM) of the amplifier circuit, has an output (1104*c*), and produces a third plurality of currents;

first and second high impedance nodes (1114*a* and 1114*b*);

a first output buffer (1108*a*) having an input connected to the first high impedance node (1114*a*), and having an output that provides a first output (OUTA) of the amplifier circuit;

a second output buffer (1108*b*) having an input connected to the second high impedance node (1114*b*), and having an output that provides a second output (OUTB) of the amplifier circuit;

a first plurality of current mirrors each of which includes at least one corresponding input and at least two corresponding outputs; and a second plurality of current mirrors each of which includes at least one corresponding input and at least two corresponding outputs;

wherein each of the first plurality of current mirrors receives one of the first plurality of currents and one of the third plurality of currents at one or more input of the current mirror, has one of the second plurality of currents drawn from one of its outputs, and has a further one of its outputs connected to the first high impedance node (1114*a*); and wherein each of the second plurality of current mirrors receives one of the second plurality of currents and one of the third plurality of currents at one or more input of the current mirror, has one of the first plurality of currents drawn from one of its outputs, and has a further one of its outputs connected to the second high impedance node (1114*b*).

14. The amplifier circuit of claim 13, wherein:

the first plurality of currents are proportional to a difference between an input voltage provided to the first DM input (IN+DM) of the amplifier circuit and a fraction of its associated output voltage at the first output (OUTA);

the second plurality of currents are proportional to a difference between an input voltage provided to the second DM input (IN−DM) of the amplifier circuit and a fraction of its associated output voltage at the second output (OUTB); and the third plurality of currents are proportional to a difference between an input voltage provided to the CM input (IN_CM) of the amplifier circuit and a fraction of its associated output voltage at the output (1104*c*) of the third input buffer (1106*c*).

15. The amplifier circuit of claim 14, wherein:

a first feedback resistor connects the first output (OUTA) of the amplifier circuit to the first feedback node (FB+) of the amplifier circuit;

a second feedback resistor connects the second output (OUTB) of the amplifier circuit to the second feedback node (FB−) of the amplifier circuit;

a third feedback resistor connects the first output (OUTA) of the amplifier circuit to the output (1104*c*) of the third input buffer (1106*c*); and a fourth feedback resistor connects the second output (OUTB) of the amplifier circuit to the output (1104*c*) of the third input buffer (1106*c*).

16. The amplifier circuit of claim 13, wherein:

a first feedback resistor connects the first output (OUTA) of the amplifier circuit to the first feedback node (FB+) of the amplifier circuit;

a second feedback resistor connects the second output (OUTB) of the amplifier circuit to the second feedback node (FB−) of the amplifier circuit;

a third feedback resistor connects the first output (OUTA) of the amplifier circuit to the output (1104*c*) of the third input buffer (1106*c*); and a fourth feedback resistor connects the second output (OUTB) of the amplifier circuit to the output (1104*c*) of the third input buffer (1106*c*).

17. A current feedback amplifier circuit, comprising:

a first input buffer (806*a* or 1106*a*) that provides a first DM input (IN+DM) of the amplifier circuit, provides a first feedback node (FB+) of the amplifier circuit, and produces a first plurality of currents;

a second input buffer (806*a* or 1106*b*) that provides a second DM input (IN−DM) of the amplifier circuit, provides a second feedback node (FB−) of the amplifier circuit, and produces a second plurality of currents;

a third input buffer (806*c* or 1106*c*) that provides a CM input (IN_CM) of the amplifier circuit, has an output (804*c* or 1104*c*), and produces a third plurality of currents;

first and second high impedance nodes (814*a* or 1114*a*, and 814*b* or 1114*b*);

a first output buffer (808*a* or 1108*a*) having an input connected to the first high impedance node (814*b* or 1114*a*), and having an output that provides a first output (OUTA) of the amplifier circuit;

a second output buffer (808*b* or 1108*b*) having an input connected to the second high impedance node (814*b* or 1114*b*), and having an output that provides a second output (OUTB) of the amplifier circuit;

a first plurality of current mirrors each of which includes at least one corresponding input and at least one corresponding output;

a second plurality of current mirrors each of which includes at least one corresponding input and at least one corresponding output;

wherein two outputs, of the first plurality of current mirrors, are connected to the first high impedance node (814*a* or 1114*a*);

wherein two outputs, of the second plurality of current mirrors, are connected to the second high impedance node (814*b* or 1114*b*);

wherein each of the first plurality of current mirrors, or each of a pair of the first plurality of current mirrors, receives one of the first plurality of currents and one of the third plurality of currents at one or more input, and has one of the second plurality of currents drawn from one of its outputs; and wherein each of the second plurality of current mirrors, or each of a pair of the second plurality of current mirrors, receives one of the second plurality of currents and one of the third plurality of currents at one or more input, and has one of the first plurality of currents drawn from one of its outputs.

18. The amplifier circuit of claim 17, wherein:

the first plurality of currents are proportional to a difference between an input voltage provided to the first DM input (IN+DM) of the amplifier circuit and a fraction of its associated output voltage at the first output (OUTA);

the second plurality of currents are proportional to a difference between an input voltage provided to the second DM input (IN−DM) of the amplifier circuit and a fraction of its associated output voltage at the second output (OUTB); and the third plurality of currents are proportional to a difference between an input voltage provided to the CM input (IN_CM) of the amplifier circuit and a fraction of its associated output voltage at the output (804*c* or 1104*c*) of the third input buffer (1106*c*).

19. The amplifier circuit of claim 18, wherein:
a first feedback resistor connects the first output (OUTA) of the amplifier circuit to the first feedback node (FB+) of the amplifier circuit;
a second feedback resistor connects the second output (OUTB) of the amplifier circuit to the second feedback node (FB−) of the amplifier circuit;
a third feedback resistor connects the first output (OUTA) of the amplifier circuit to the output (804*c* or 1104*c*) of the third input buffer (806*c* or 1106*c*); and
a fourth feedback resistor connects the second output (OUTB) of the amplifier circuit to the output (804*c* or 1104*c*) of the third input buffer (806*c* or 1106*c*).

20. The amplifier circuit of claim 17, wherein:
a first feedback resistor connects the first output (OUTA) of the amplifier circuit to the first feedback node (FB+) of the amplifier circuit;
a second feedback resistor connects the second output (OUTB) of the amplifier circuit to the second feedback node (FB−) of the amplifier circuit;
a third feedback resistor connects the first output (OUTA) of the amplifier circuit to the output (804*c* or 1104*c*) of the third input buffer (806*c* or 1106*c*); and
a fourth feedback resistor connects the second output (OUTB) of the amplifier circuit to the output (804*c* or 1104*c*) of the third input buffer (806*c* or 1106*c*).

* * * * *